(12) United States Patent
Eriksen

(10) Patent No.: US 9,155,230 B2
(45) Date of Patent: Oct. 6, 2015

(54) COOLING SYSTEM FOR A SERVER

(75) Inventor: André Sloth Eriksen, Morgan Hill, CA (US)

(73) Assignee: ASETEK DANMARK A/S, Aalborg East (DK)

( * ) Notice: Subject to any disclaimer, the term of this patent is extended or adjusted under 35 U.S.C. 154(b) by 180 days.

(21) Appl. No.: 13/304,813

(22) Filed: Nov. 28, 2011

(65) Prior Publication Data

US 2012/0147553 A1 Jun. 14, 2012

(51) Int. Cl.
*H05K 7/20* (2006.01)

(52) U.S. Cl.
CPC ........ *H05K 7/20772* (2013.01); *H05K 7/20781* (2013.01)

(58) Field of Classification Search
USPC ........................ 361/676–678, 679.46–679.54, 361/688–723, 752, 760, 831
See application file for complete search history.

(56) References Cited

U.S. PATENT DOCUMENTS

| | | | |
|---|---|---|---|
| 6,763,880 B1 | 7/2004 | Shih | |
| 6,796,372 B2 * | 9/2004 | Bear | 165/104.21 |
| 6,807,056 B2 | 10/2004 | Kondo et al. | |
| 6,819,563 B1 | 11/2004 | Chu et al. | |
| 6,896,612 B1 | 5/2005 | Novotny | |
| 7,012,807 B2 | 3/2006 | Chu et al. | |
| 7,277,282 B2 | 10/2007 | Tate | |
| 7,318,322 B2 | 1/2008 | Ota et al. | |
| 7,372,698 B1 | 5/2008 | Tilton et al. | |
| 7,420,804 B2 | 9/2008 | Leija et al. | |
| 7,438,124 B2 | 10/2008 | Bhatti et al. | |
| 7,525,207 B2 | 4/2009 | Clidaras et al. | |
| 7,593,227 B2 * | 9/2009 | Campbell et al. | 361/699 |
| 7,599,184 B2 | 10/2009 | Upadhya et al. | |
| 7,639,499 B1 | 12/2009 | Campbell et al. | |
| 7,757,506 B2 | 7/2010 | Ellsworth, Jr. et al. | |
| 7,957,132 B2 | 6/2011 | Fried | |
| 8,077,463 B2 | 12/2011 | Lee | |
| 8,094,453 B2 | 1/2012 | Campbell et al. | |
| 8,274,787 B2 | 9/2012 | Alyaser et al. | |

(Continued)

FOREIGN PATENT DOCUMENTS

| | | |
|---|---|---|
| DE | 203 08 158 | 7/2003 |
| WO | WO 2010/054786 A1 | 5/2010 |

OTHER PUBLICATIONS

HP Modular Cooling System: Technology Overview and Applications Brief, pp. 1-13 (2006).

(Continued)

*Primary Examiner* — Courtney Smith
(74) *Attorney, Agent, or Firm* — Finnegan, Henderson, Farabow, Garrett & Dunner LLP

(57) ABSTRACT

Embodiments of the disclosure may include a system for cooling a computer server including a plurality of server modules. The system may include a first cooling system configured to remove heat from the plurality of server modules, the first cooling system including a first plurality of conduits for circulating a first cooling medium through the first cooling system, a second cooling system configured to remove heat from the first cooling system, the second cooling system including a second plurality of conduits for circulating a second cooling medium through the second cooling system, and a manifold configured to couple the first cooling system and the second cooling system, wherein the first plurality of conduits is removably connected to the manifold.

17 Claims, 4 Drawing Sheets

(56) References Cited

U.S. PATENT DOCUMENTS

| | | |
|---|---|---|
| 8,289,710 B2 | 10/2012 | Spearing et al. |
| 8,427,831 B2 | 4/2013 | Wei |
| 8,437,129 B2 * | 5/2013 | Tung et al. .............. 361/679.47 |
| 8,441,789 B2 * | 5/2013 | Wu et al. ................. 361/679.49 |
| 8,493,738 B2 | 7/2013 | Chainer et al. |
| 2003/0128525 A1 * | 7/2003 | Berry et al. .................... 361/726 |
| 2004/0095721 A1 | 5/2004 | Ellsworth et al. |
| 2006/0187638 A1 | 8/2006 | Vinson et al. |
| 2007/0297136 A1 * | 12/2007 | Konshak ....................... 361/699 |
| 2008/0068793 A1 | 3/2008 | Ishimine |
| 2009/0027856 A1 | 1/2009 | McCoy |
| 2009/0056910 A1 | 3/2009 | Mallia et al. |
| 2009/0080151 A1 * | 3/2009 | Kalms et al. ............. 361/679.52 |
| 2009/0086434 A1 | 4/2009 | Hodes et al. |
| 2009/0126909 A1 * | 5/2009 | Ellsworth et al. ........ 165/104.33 |
| 2009/0126910 A1 | 5/2009 | Campbell et al. |
| 2009/0154096 A1 | 6/2009 | Iyengar et al. |
| 2009/0161312 A1 * | 6/2009 | Spearing et al. ......... 361/679.47 |
| 2009/0260777 A1 | 10/2009 | Attlesey |
| 2009/0262495 A1 | 10/2009 | Neudorfer |
| 2009/0284924 A1 * | 11/2009 | Konshak et al. ............. 361/700 |
| 2010/0032140 A1 | 2/2010 | Copeland et al. |
| 2010/0085708 A1 | 4/2010 | Martin |
| 2010/0101765 A1 * | 4/2010 | Campbell et al. ........ 165/104.33 |
| 2011/0056675 A1 | 3/2011 | Barringer et al. |
| 2012/0106071 A1 * | 5/2012 | Eagle ....................... 361/679.47 |

OTHER PUBLICATIONS

Patterson, Michael K. et al., The State of Data Center Cooling, A Review of Current Air and Liquid Cooling Solutions, Intel Corporation, pp. 1-12 (Mar. 2008).

Declaration of Himanshu Pokharna, Ph.D., in inter Partes Review Case No. 2014-01172, dated Jul. 16, 2014, (71 pages).

International Search Report and Written Opinion for International Application No. PCT/US2011/048735, dated Dec. 15, 2011, (12 pages).

International Search Report and Written Opinion for International Application No. PCT/IB2012/002702, dated Jul. 24, 2013, (11 pages).

Notice of Allowance from U.S. Appl. No. 14/186,397, mailed Apr. 3, 2014, (7 pages).

Petition for inter Partes Review of U.S. Pat. No. 8,749,968, filed Jul. 16, 2014, (61 pages).

Random House Webster's College Dictionary, Random House, Inc., New York, 2000, p. 230, (3 pages).

U.S. Appl. No. 61/377,249, filed Aug. 26, 2010, (28 pages).

* cited by examiner

COOLING SYSTEM FOR A SERVER

TECHNICAL FIELD

The present disclosure is related generally to systems and methods of cooling heat generating components of a computer server or other systems that operate in an enclosed data processing environment, and computer servers and systems incorporating the cooling system.

BACKGROUND

Electronic systems, such as, for example, computer systems include several integrated circuit (IC) devices that generate heat during operation. For effective operation of the computer system, the temperature of the IC devices have to be maintained within acceptable limits. While the problem of heat removal from IC devices is an old one, this problem has increased in recent years due to greater numbers of transistors that are packed into a single IC device while reducing the physical size of the device. Increasing number of transistors compacted into a smaller area results in a greater concentration of heat that must be removed from that smaller area. Bundling multiple computer systems together, such as, for example, in a server, further aggravates the heat removal problem by increasing the amount of heat that has to be removed from a relatively small area.

In a typical computer server ("server"), multiple computer server modules ("modules") are stacked together in a rack or a case to consolidate network resources and minimize floor space. Modules which are designed for use in a server configuration are typically characterized by a motherboard comprising heat generating electronic components (such as IC devices) housed in a modular chassis or case, which in turn is mounted together with other similar modules, in a rack, blade cabinet, blade server, or other support structure. In practice, multiple servers (each comprising several modules) are typically located in an enclosed space such as a server room or a data center. During operation, the electronic components in the individual modules generate heat which must be removed for effective functioning of the server. FIG. 1 illustrates an prior art method used to cool multiple servers (each containing multiple modules) housed in an enclosed environment such as, for example, a server room. In such a prior art system, cooling fans are used circulate ambient air from the server room through the multiple modules of a server to absorb heat therefrom. In the prior art system, cool air directed into the server room through a cold air plenum is passed through the servers to absorb heat generated by IC devices and other heat generating components therein. After absorbing the generated heat, the heated air is exhausted back into the server room. This heated air is directed through a warm air plenum to a computer room air conditioning (CRAC) system to cool the air and recirculate it back to the server room through the cold air plenum.

It is known that a large portion (greater than about 31%) of the energy consumption of a typical server room is used in the operation of the CRAC system, and that significant energy savings and resultant green house gas reduction can be achieved by improving the efficiency of the CRAC system. "Data Center Energy Characterization Study Site Report," February 2001, available at http://hightech.lbl.gov/documents/DATA_CENTERS/DC_Benchmarking/Data_Center_Facility1.pdf; "Energy Consumption of Information Technology Data Centers," and references cited therein, Iyengar et al., December 2010, available at http://www.electronics-cooling.com/2010/12/energy-consumption-of-information-technology-data-centers/. Improving the cooling efficiency of servers housed in a server room thereby enables more efficient utilization and conservation of available energy resources, and green house gas emission reduction.

The disclosed cooling systems and methods are directed to an energy efficient approach of cooling one or more servers located in an enclosed environment, such as a server room.

SUMMARY OF THE DISCLOSURE

In one aspect, a system for cooling a computer server including a plurality of server modules is disclosed. The system may include first cooling system configured to remove heat from the plurality of server modules, the first cooling system including a first plurality of conduits for circulating a first cooling medium through the first cooling system, a second cooling system configured to remove heat from the first cooling system, the second cooling system including a second plurality of conduits for circulating a second cooling medium through the second cooling system, and a manifold configured to couple the first cooling system and the second cooling system, wherein the first plurality of conduits is removably connected to the manifold.

In another aspect, a system for cooling a computer server including a plurality of server modules is disclosed. The system may include a first cooling system configured to remove heat from the plurality of server modules, the first cooling system including a first cooling medium configured to transfer heat to a hot plate of the first cooling system, a second cooling system configured to remove heat from the first cooling system, the second cooling system including a second cooling medium configured to transfer heat to a cooling device, and a manifold configured to couple the first cooling system and the second cooling system, wherein the plurality of modules is removably connected to the manifold.

In yet another aspect, a system for cooling a computer server including a plurality of server modules is disclosed. The system may include a first cooling system configured to remove heat from the plurality of server modules, the first cooling system including a first plurality of conduits for circulating a first cooling medium through the first cooling system, a second cooling system configured to remove heat from the first cooling system, the second cooling system including a second plurality of conduits for circulating a second cooling medium through the second cooling system, and a manifold configured to enclose at least a portion of the first plurality of conduits and at least a portion of the second plurality of conduits, wherein the plurality of modules is removably connected to the manifold.

DETAILED DESCRIPTION

The following detailed description illustrates the cooling system by way of example and not by way of limitation. Although the description below describes an application of a cooling system to servers housed in an enclosed environment, embodiments of the disclosed cooling systems may be applied to cool heat generating components in any application. For example, embodiments of the current disclosure may be used to cool portable computers that operate while being docked to a docking station. The description enables one skilled in the art to make and use the present disclosure for cooling any electronic component within a console or a chassis.

Reference will now be made to exemplary embodiments of the invention, examples of which are illustrated in the accompanying drawings. Wherever possible, the same reference numbers will be used throughout the drawings to refer to the same or like parts. Elements or parts designated using the same reference numbers in different figures perform similar functions. Therefore, for the sake of brevity, these elements may not be described with reference to every figure. In the description that follows, if an element is not described with reference to a figure, the description of the element made with reference to another figure applies.

Figure 1:
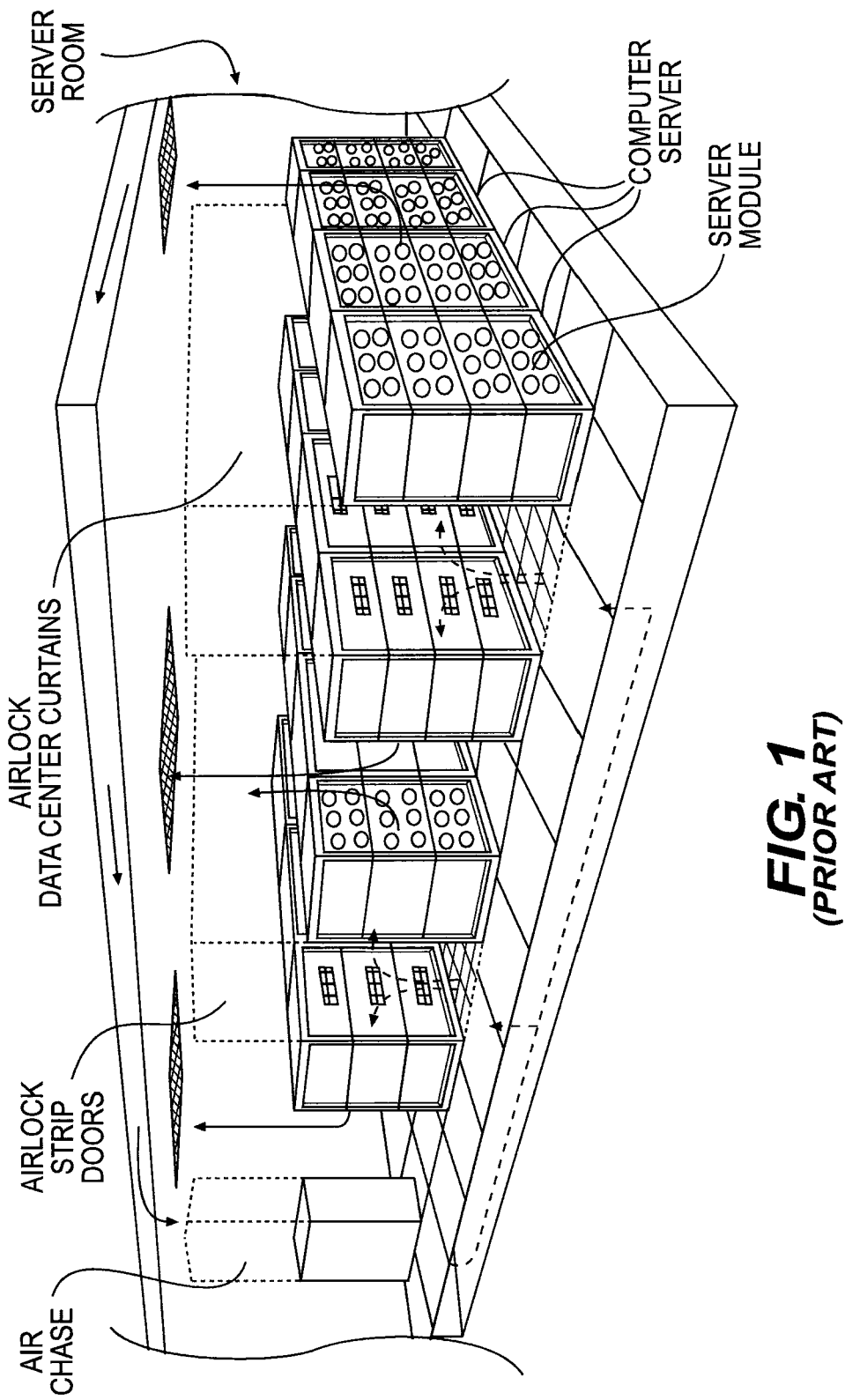
FIG. 1 illustrates a prior art server room cooling system.
Figure 2:
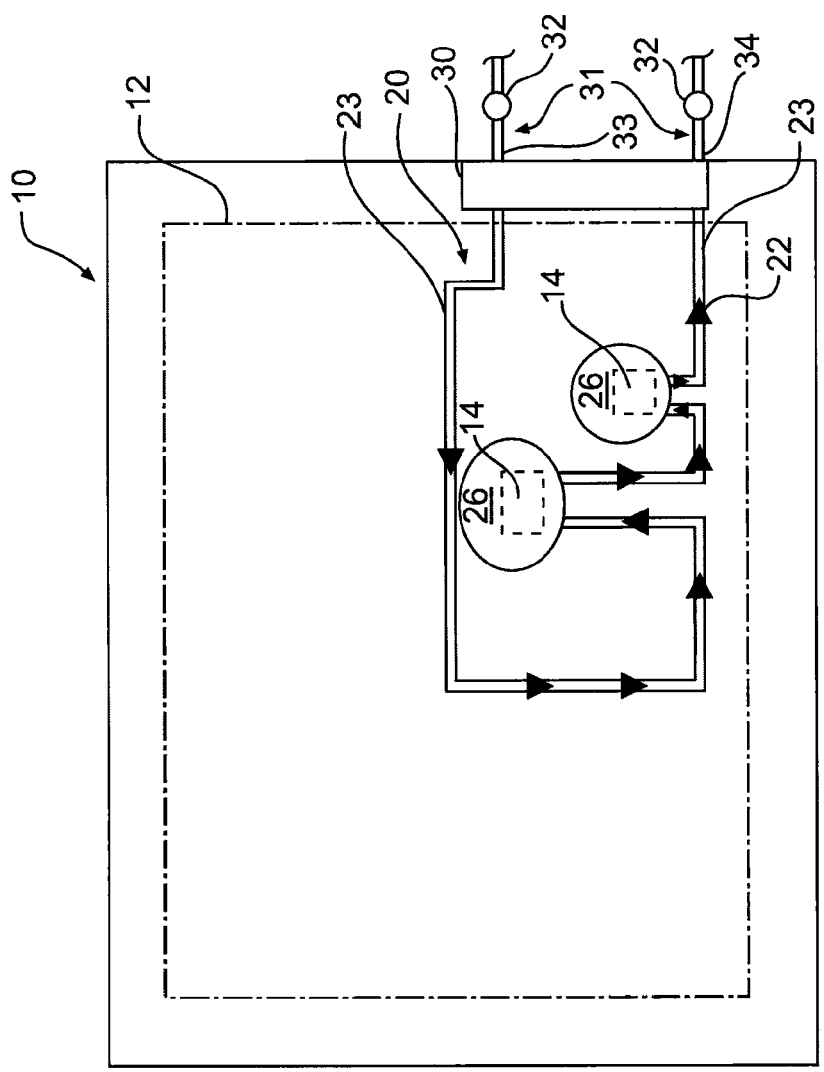
FIG. 2 is an illustration of an exemplary embodiment of the disclosed cooling system applied to a server module.

FIG. 2 illustrates an exemplary individual computer server unit (or a module 10) having a modular chassis adapted for placement in a server rack. Module 10 includes a motherboard 12 having mounted thereon (or attached thereto, such as, for example, by using a data cable) a plurality of heat generating electronic devices 14. These electronic devices 14 may include, without limitation, any type of IC or other devices (such as, for example, CPUs, GPUs, memory, power supplies, disk drives, controllers, etc.) that are found in typical computer systems.

Module 10 may also include a cooling system 20 configured to directly cool one or more electronic devices 14 of the module 10. To directly cool an electronic device 14, a cold plate 26 of the cooling system 10 may be placed in thermal contact (directly in contact, or in contact through a heat transfer medium, such as, for example, thermal grease or a thermal pad) with the electronic device 14. Because of thermal contact, heat may be transferred from the electronic device 14 to the cold plate 26. A coolant 22 of the cooling system 20 may pass through the cold plate 26 to remove heat from, and thereby cool, the electronic device 14. As will be described in more detail below, conduits 23 may deliver the coolant 22 to the cold plates 26 and may couple the coolant 22 to a suitable heat exchanger. In some embodiments, the cooling system 20 may also include pumps or other liquid moving devices (not shown) to assist in transferring the coolant 22 to and from the cold plates 26. Alternatively, some configurations of the cooling system 20 may not include a pump, and instead, rely upon the expansion and contraction of the coolant 22 as it absorbs and dissipates heat to propel the coolant 22 to and from the cold plates 26. Any liquid, such as, for example, water, alcohol, mixtures of alcohol and water, etc. may be used as the coolant 22. It should also be appreciated that the coolant 22 may include a dielectric fluid incapable of conducting electricity. Using the dielectric fluid may therefore prevent damage to the components of module 10, including electronic devices 14, if a leak in the cooling system 20 were to occur in module 10. Non-limiting examples of such dielectric fluids may include deionized water, mineral oils, and mixtures thereof. Such dielectric fluids may also be fluorescent. Although the coolant 22 is described as a liquid, in some embodiments, a phase change material may be used as the coolant 22. In these embodiments, a coolant 22 in a liquid phase may transform to a gaseous phase after absorption of heat at the cold plates 26. The coolant 22 may transform back to the liquid phase after transferring the absorbed heat from the cold plates 26. In some embodiments, valves or other known fluid control devices (not shown) may be provided in the cooling system 20 to control the flow of the coolant 22 therein. Any type of cold plate 26 configured to transfer heat from the electronic device 14 to the coolant 22 circulating within the cooling system 20 may be used as the cold plate 26. The cold plate 26 may include fins, pins, or other such features to assist in transferring the heat from the cold plate 26 to the coolant 22. In some embodiments, devices used to transfer heat from heat generating electronic devices to the coolant in co-assigned patent application Ser. Nos. 10/578,578, 11/919,974, 12/826,736, 12/914,190, and 12/914,263, with appropriate modifications, may be used as cold plate 26. These patent applications are incorporated by reference herein in their entirety. Although FIG. 2 illustrates two electronic devices 14 as being directly cooled by liquid cooling system 20, this is only exemplary. In general, any number of electronic devices 14 of module 10 may be directly cooled by the cooling system 20 via any number of cold plates 26.

Conduits 23 may exit module 10 via one or more holes defined on the chassis of module 10. In certain embodiments, an empty PCI blind shield 30 may be coupled to the chassis of the module 10 and may direct conduits 23 out of module 10. Terminal ends 31 of conduits 23 may be fluidly coupled to one or more fluid connectors 32. More particularly, an inlet conduit 33 configured to direct coolant 22 into module 10 and an outlet conduit 34 configured to direct coolant 22 out of module 10 may be fluidly coupled to fluid connectors 32. Fluid connector 32 may be any suitable connection apparatus configured to fluidly couple conduits 23 to any other appropriate fluid conduit. Fluid connectors 32 may also be configured to readily connect and disconnect conduits 23 to and from any other appropriate fluid conduit. Moreover, fluid connectors 32 may be self-sealing and may prevent fluid from conduits 23 from leaking out of connectors 32 once connected and/or disconnected to another conduit. For example, fluid connectors 32 may include any suitable quick connectors, luer locks, and the like.

Figure 3:
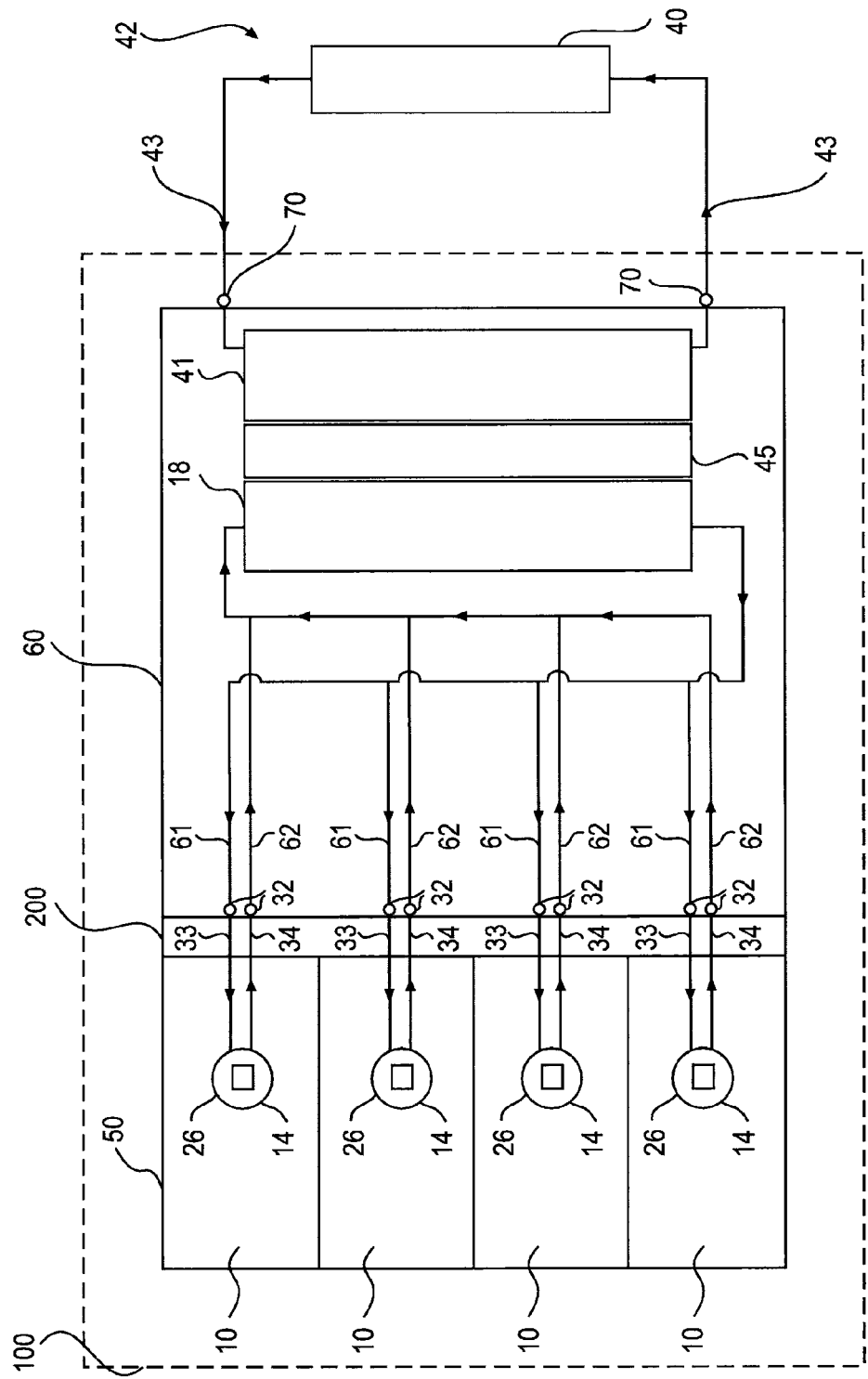
FIG. 3 is an illustration of an exemplary embodiment of the disclosed cooling system applied to an exemplary server unit.

In a server application, as illustrated in FIG. 3, several server modules 10 may be mounted on a server rack 50 positioned in a server room 100. The rack 50 may in turn be operably coupled to a manifold 60. The manifold 60 may include any suitable housing configured to enclose a number of fluid conduits and components and direct fluid to a number of components inside and/or outside the manifold 60. Moreover, the manifold 60 may be configured to be mounted on any suitable server rack 50. On a server side of the manifold 60, the manifold 60 may be fluidly coupled to the modules 10, and on a heat exchanger side of the manifold 60, the manifold may be fluidly coupled to a secondary cooling system 42. Coolant 22 of the cooling systems 20 may be directed into manifold 60, cooled by the secondary cooling system 42, and returned back into the modules 10 to remove heat from the electronic devices 14.

As discussed above, modules 10 may be fluidly coupled to manifold 60. More particularly, conduits 23 may be fluidly coupled to the manifold 60 via fluid connectors 32. That is, fluid connectors 32 may fluidly connect an inlet conduit 33 of each cooling system 20 to an outlet line 61 enclosed in manifold 60, and may fluidly connect an outlet conduit 34 of each cooling system 20 to an inlet line 62 enclosed in manifold 60. In certain embodiments, an extension housing 200 may be coupled to the server rack 50 and may house the inlet conduits 33 and the outlet conduits 34 of the cooling systems 20. Fluid connectors 32 may be positioned external the extension housing 200 and may be fluidly coupled to the outlet lines 61 or the inlet lines 62 internal or external the manifold 60. In other embodiments, the extension housing 200 may be eliminated, and the manifold 60 may be directly mounted to the server rack 50.

The inlet lines 62 enclosed in manifold 60 may deliver the coolant 22 of the cooling system 20 to one or more hot plates 18, and the coolant 22 may become cooled thereby. The relatively cooler coolant 22 may then flow out of the one or more hot plates 18, through the outlet lines 61 enclosed in manifold 60 and the inlet conduits 33 of the cooling systems 20, and back to the cold plates 26 to absorb heat produced by the electronic devices 14. The hot plate 18 may be enclosed within the manifold 60 and may include any suitable component configured to provide heat transfer between a coolant and a heat exchange surface. For example, the hot plate 18 may include one or more features of the hot plate and the cold plate disclosed in co-assigned patent application Ser. No. 13/215,384, which is incorporated by reference herein in its entirety.

The coolant 22 may be cooled by drawing heat from the one or more hot plates 18 via the secondary cooling system 42. As illustrated in FIG. 3, the secondary cooling system 42 may circulate a thermal transfer medium 43 therethrough to absorb heat from the cooling systems 20 associated with different modules 10, and discharge the heat removed from these modules 10. Any type of fluid, such as water, alcohol, mixtures thereof, a gas, etc. may be used as the thermal transfer medium 43. It is also contemplated that, in some embodiments, a phase change material may be used as the thermal transfer medium 43. In some embodiments, the secondary cooling system 42 may be a closed-loop cooling system. However, it is contemplated that in other embodiments, the secondary cooling system 42 may be an open-loop system.

As illustrated in FIG. 3, the secondary cooling system 42 may absorb heat from one or modules 10 positioned in the server room 100, and discharge the heat outside the server room 100. The secondary cooling system 42 may include of one or more cold plate elements 41, a cooling device 40 disposed external to the server room 100, and conduits to transfer the thermal transfer medium 43 between the cooling device 40 and the one or more cold plate elements 41. The one or more cold plate elements 41 may include any suitable component configured to provide heat transfer between a coolant and a heat exchange surface. For example, the one or more cold plate elements 41 may include one or more features of the hot plate and the cold plate disclosed in co-assigned patent application Ser. No. 13/215,384. The cooling device 40 may include any suitable device configured to remove heat from the thermal transfer medium 43 passing therethrough, such as, for example, an air-to-liquid heat exchanger. The one or more cold plate elements 41 and at least a portion of the conduits of the secondary cooling system 42 may also be enclosed within the manifold 60, and the one or more cold plate elements 41 may be placed in thermal contact (directly in contact, or in contact through a heat transfer medium 45, such as, for example, thermal grease or a thermal pad) with the one or more hot plates 18 of the cooling system 20. Because of the thermal contact, heat may be transferred from the one or more hot plates 18 to the one or more cold plate elements 41. The thermal transfer medium 43 may be circulated between the cooling device 40 and the one or more cold plate elements 41 and may thus draw heat from the one or more hot plates 18 of the modules 10 and discharge the heat external to the server room 100. In some embodiments, pumps and/or other control devices may be provided to assist in directing the thermal transfer medium 43 through the secondary cooling system 42. Transferring the heat generated by the servers outside the server room 100 avoids heating the air in the server room 100, and thus reduces the cooling load of the server room cooling system. It is also contemplated that the heat removed from the server room by thermal transfer medium 43 may be used to do useful work. For instance, this removed heat may be used in an HVAC system to heat a building.

It should be appreciated that the secondary cooling system 42 may provide heat transfer by non-active means. In other words, the secondary cooling system 42 does not require a source of energy or power to actively remove heat from the modules 10. Instead, for example, the cooling device 40 may be positioned outside of the server room 100 and may cool the thermal transfer medium 43 of secondary cooling system 42 by contact with ambient air. The ambient air may be, as examples, the air outside of the building in which server room 100 is located or the air inside the building but outside of the server room 100. Because additional power is not required to chill the thermal transfer medium 43, costs and energy savings may be gained. It should also be appreciated that one or more fans or other air moving devices may be associated with the cooling device 40 to direct more ambient air onto the cooling device and provide increased cooling of the thermal transfer medium 43 with minimal energy consumption. Furthermore, only the electronic devices 14, which may include CPUs, GPUs, memories, and the like, of modules 10 may be cooled by the disclosed cooling system. Such electronic devices 14 may produce the most heat in the modules 10 because they consume the most power; however, such electronic device 14 may still be capable of functioning at relatively high temperatures. Accordingly, ambient air may be sufficient to cool the devices 14 to a suitable functioning temperature, while simultaneously removing the majority of the heat produced in modules 10.

In certain embodiments, the fluid connectors 70, similar to the fluid connectors 32, may be associated with the manifold 60 to fluidly couple the one or more cold plate elements 41 enclosed within the manifold 60 to the cooling device 40 outside the server room 100. In other words, the conduits of the secondary cooling system 42 providing fluid communication between the one or more cold plate elements 41 and the cooling device 40 may be readily connected and disconnected via the fluid connectors 70. Accordingly, the fluid connectors 70, along with the fluid connectors 32, may allow the modules 10, the manifold 60, and the cooling device 40 to be readily detached from each other for, as examples, service and maintenance purposes. It should be appreciated that the fluid connectors 70 may be disposed within the housing of the manifold 60 or may be disposed external the housing of the manifold 60 housing. In addition, because the fluid connectors 32, 70 may be self-sealing, messes and clean-ups due to fluid leakages may be reduced. Moreover, the fluid connectors 32, 70 and manifold 60 may also provide quick and eased installation of the modules 10 to the cooling device 40 for heat removal.

The fluid connectors 32 may also provide the ability to readily connect and disconnect individual modules 10 from the manifold 60, and thus, selectively control cooling of one or more modules 10 mounted on the server rack 50. For example, if one or more modules 10 requires service and/or repair, those modules 10 may be selectively disconnected from the manifold 60, while the remaining modules 10 may be operably connected to the manifold 60 and have their respective electronic devices 14 cooled.

Furthermore, it should be appreciated that the fluid connectors 32, 70 and the manifold 60 may provide a modular mechanism for cooling the modules 10. In certain embodiments, the fluid connectors 70 may instead be fluidly coupled to existing facilities lines (not shown), which in turn, may direct chilled coolant to the one or more cold plate elements 41. In other words, the manifold 60 may allow the modules 10 to change the manner in which they are cooled. For example, a technician may disconnect the fluid connectors 70 from the cooling device 40 illustrated in FIG. 3 and may reconnect the fluid connectors 70 to the existing facilities line as an alternative source for cooling.

Moreover, configuration of the manifold 60, the fluid connectors 32, and the fluid connectors 70 may provide two separate cooling loops: a cooling loop associated with the cooling systems 20 and a cooling loop associated with the secondary cooling system 42. Separating the loops of the cooling systems 20 and the secondary cooling system 42 may ease the maintenance and servicing of the server. For example, if a coolant leak is detected in the server (i.e., a leak associated with the cooling systems 20), only the coolant 22 may be removed and replaced to fix the leak, and the thermal transfer medium 43 need not be removed and/or replaced since the cooling systems 20 and the secondary cooling system 42 may be separated. Accordingly, the volume of coolant that ultimately may be lost and replaced may be minimized, thus reducing maintenance and servicing costs. Furthermore, it should be appreciated that since the fluid connectors 32, 70 may be self-sealing, the manifold 60 may be manufactured and distributed with the coolant 22 and the thermal transfer medium 43 pre-filled in the appropriate conduits within the manifold 60.

It should also be appreciated that, in certain embodiments, the secondary cooling system 42 may be eliminated, and at least a portion of manifold 60 enclosing the one or more hot plates 18 may be positioned outside of the server room 100 to draw heat away from the coolant 22.

Figure 4:
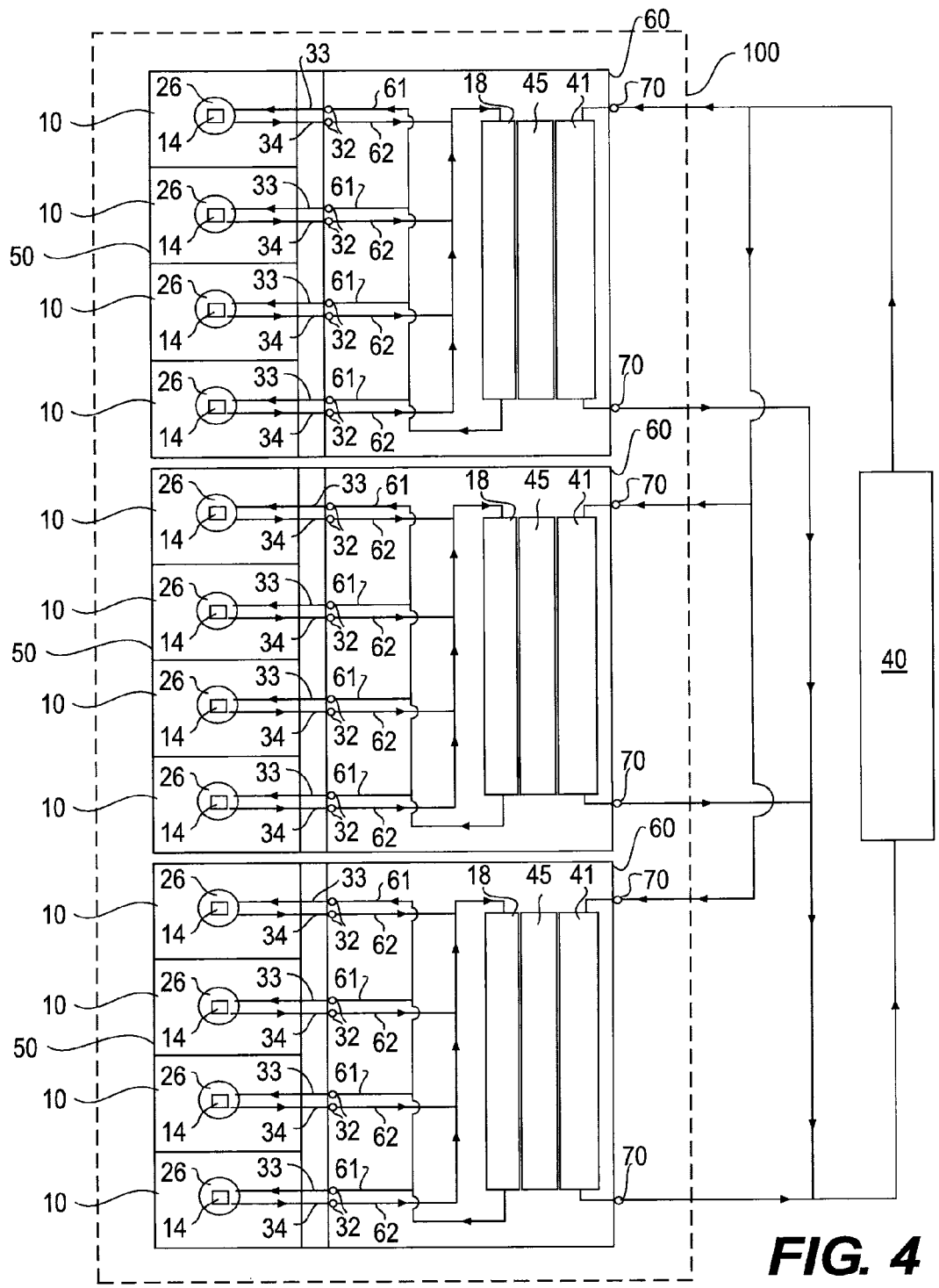
FIG. 4 is an illustration of an exemplary embodiment of the disclosed cooling system applied to multiple server units.

FIG. 4 illustrates another embodiment of a server application, wherein the server room 100 includes several server racks 50 with modules 10 mounted thereon. In certain embodiments, and with reference to FIG. 3, each server rack 50 may be coupled to its own dedicated cooling device 40. Separate cooling devices 40 may provide increased cooling for the modules mounted on each server rack 50, and may also ease maintenance and service as each server rack 50 may be attended to separately if, for example, one or more of the cooling devices 40 were to be inspected and serviced. It should be appreciated, however, that each server rack 50 may be coupled to a single cooling device 40, as illustrated in FIG. 4. Utilizing a single cooling device 40 may reduce the amount of materials and components for cooling the modules 10 and may also minimize the amount of space taken up by the cooling device 40.

In certain embodiments, it should be appreciated that one or more secondary manifolds may be fluidly coupled to the server rack 50 and the manifold 60. In such embodiments, for example, any number of sub-racks may be mounted to the server rack 50. Each sub-rack may include a plurality of server modules, blade servers, or the like coupled together and mounted to the sub-rack. A secondary manifold may be fluidly coupled to each sub-rack in a similar manner as discussed above in the embodiments of FIGS. 2-4. Coolant, such as coolant 22, may be directed from the manifold 60 to each of the modules of the sub-rack to cool one or more electronic devices, such as electronic device 14. The coolant from each of the modules may then be delivered through the secondary manifold, and a single line of the secondary manifold may direct the coolant into manifold 60 for cooling. The coolant may be cooled and then returned to each of the modules of the sub-rack.

Because the disclosed server cooling system enables the modules 10 of servers to be cooled without transferring heat to the server room 100, the necessity for large CRAC systems is eliminated. In addition, the cooling device 40 of the secondary cooling system 42 consumes zero to minimal power since ambient air may be employed to remove heat from the cooling device 40. Eliminating the need for large CRAC systems to cool the server room 100 and employing ambient air to remove heat from the modules thereby greatly reduces power consumption associated with cooling the servers. This reduction in power consumption enables more efficient utilization and conservation of available energy resources, and concomitant reduction in green house gas emissions.

It will be apparent to those skilled in the art that various modifications and variations can be made to the disclosed cooling systems. Other embodiments will be apparent to those skilled in the art from consideration of the specification and practice of the disclosed cooling systems. It is intended that the specification and examples be considered as exemplary only, with a true scope being indicated by the following claims and their equivalents.

What is claimed is:

1. A system for cooling a computer server including one or more server modules, the system comprising:
   a first plurality of conduits for circulating a first cooling medium among the one or more server modules, wherein the first plurality of conduits includes at least one server cold plate dimensioned to thermally connect to at least one heat generating component of the one or more server modules;
   a second plurality of conduits for circulating a second cooling medium through a cooling device positioned at a location remote from the computer server; and
   a fluid distribution and collection manifold including:
      at least one first inlet line having a first inlet fluid connector for fluidly and removably connecting to the first plurality of conduits to collect the first cooling medium from the first plurality of conduits;
      at least one first outlet line having a first outlet fluid connector for fluidly and removably connecting to the first plurality of conduits to distribute the first cooling medium to the first plurality of conduits;
      at least one second inlet line having a second inlet fluid connector for fluidly and removably connecting to the second plurality of conduits to collect the second cooling medium from the second plurality of conduits;
      at least one second outlet line having a second outlet fluid connector for fluidly and removably connecting to the second plurality of conduits to distribute the second cooling medium to the second plurality of conduits;
      a hot plate; and
      a cold plate thermally coupled to the hot plate;
   wherein, when connected to the manifold via the first outlet and first inlet fluid connectors, the first plurality of conduits and the first inlet and first outlet lines form a first fluid loop that allows the first cooling medium to circulate between the first plurality of conduits, the first inlet and first outlet lines, and the hot plate to transfer the heat from the one or more server modules to the hot plate; and
   wherein, when connected to the manifold via the second outlet and second inlet fluid connectors, the second plurality of conduits and the second inlet and second outlet lines form a second fluid loop, separate from the first fluid loop, that allows the second cooling medium to circulate between the second plurality of conduits, the second inlet and second outlet lines, and the cold plate to transfer the heat from the cold plate to the cooling device at the location remote from the computer server.

2. The system of claim 1, wherein each of the one or more server modules includes at least one CPU.

3. The system of claim 1, wherein the at least one server cold plate is fluidly connected to the first plurality of conduits.

4. The system of claim 1, wherein the first fluid loop and the second fluid loop do not fluidly connect with each other.

5. The system of claim 1, wherein the cold plate is in thermal contact with the hot plate.

6. The system of claim 5, further comprising a thermal medium located between the hot plate and the cold plate to promote transfer of heat from the hot plate to the cold plate.

7. The system of claim 1, wherein the first plurality of conduits and the second plurality of conduits are arranged to connect the computer server with the cooling device, when the computer server is positioned in an enclosed room and when the cooling device is positioned outside the enclosed room, to dissipate the heat from the cold plate to a region outside of the enclosed room.

8. The system of claim 1, wherein the first inlet and first outlet fluid connectors seal the first cooling medium from leaking out of the first plurality of conduits when disconnected from the manifold.

9. The system of claim 1, wherein the second inlet and second outlet fluid connectors seal the second cooling medium from leaking out of the second plurality of conduits when disconnected from the manifold.

10. The system of claim 1, further comprising at least one pump.

11. The system of claim 1, wherein the first plurality of conduits connects a second server module for circulating the first cooling medium among the one or more server modules.

12. The system of claim 1, wherein the fluid distribution and collection manifold includes a plurality of cold plates.

13. The system of claim 1, wherein the fluid distribution and collection manifold includes a plurality of first inlet lines that join together within the manifold.

14. The system of claim 13, wherein the plurality of first inlet lines join together prior to fluidly connecting with the hot plate.

15. A method of cooling a computer server including a plurality of server modules, comprising:
fluidly connecting a first plurality of conduits to a fluid distribution and collection manifold via a first plurality of fluid connectors to form a first fluid loop;
fluidly connecting a second plurality of conduits to the fluid distribution and collection manifold via a second plurality of fluid connectors to form a second fluid loop, separate from the first fluid loop;
circulating a first cooling medium through the first fluid loop to transfer heat from the plurality of server modules to the first cooling medium, and from the first cooling medium to a hot plate located within the fluid distribution and collection manifold;
circulating a second cooling medium through the second fluid loop to transfer heat from a cold plate located within the fluid distribution and collection manifold to the second cooling medium, and from the second cooling medium to a cooling device located remotely from the plurality of server modules; and
thermally connecting at least one server cold plate to at least one heat generating component of the plurality of server modules, wherein the at least one server cold plate is fluidly connected to the first plurality of conduits.

16. A system for cooling a computer server including one or more server modules, the system comprising:
a first plurality of conduits for circulating a first cooling medium among the one or more server modules;
a second plurality of conduits for circulating a second cooling medium through a cooling device positioned at a location remote from the computer server; and
a fluid distribution and collection manifold including:
at least one first inlet line having a first inlet fluid connector for fluidly and removably connecting to the first plurality of conduits to collect the first cooling medium from the first plurality of conduits;
at least one first outlet line having a first outlet fluid connector for fluidly and removably connecting to the first plurality of conduits to distribute the first cooling medium to the first plurality of conduits;
at least one second inlet line having a second inlet fluid connector for fluidly and removably connecting to the second plurality of conduits to collect the second cooling medium from the second plurality of conduits;
at least one second outlet line having a second outlet fluid connector for fluidly and removably connecting to the second plurality of conduits to distribute the second cooling medium to the second plurality of conduits; and
a heat exchanger, wherein the heat exchanger includes a plurality of cold plates;
wherein, when connected to the manifold via the first outlet and first inlet fluid connectors, the first plurality of conduits and the first inlet and first outlet lines form a first fluid loop that allows the first cooling medium to circulate between the first plurality of conduits, the first inlet and first outlet lines, and the heat exchanger; and
wherein, when connected to the manifold via the second outlet and second inlet fluid connectors, the second plurality of conduits and the second inlet and second outlet lines form a second fluid loop, separate from the first fluid loop, that allows the second cooling medium to circulate between the second plurality of conduits, the second inlet and second outlet lines, and the heat exchanger, and the heat exchanger thermally connects the first fluid loop and the second fluid loop without fluidly connecting the first fluid loop and the second fluid loop.

17. A system for cooling a computer server including one or more server modules, the system comprising:
a first plurality of conduits for circulating a first cooling medium among the one or more server modules, wherein the first plurality of conduits connects to a second server module for circulating the first cooling medium among the one or more server modules;
a second plurality of conduits for circulating a second cooling medium through a cooling device positioned at a location remote from the computer server; and
a fluid distribution and collection manifold including:
at least one first inlet line having a first inlet fluid connector for fluidly and removably connecting to the first plurality of conduits to collect the first cooling medium from the first plurality of conduits;
at least one first outlet line having a first outlet fluid connector for fluidly and removably connecting to the first plurality of conduits to distribute the first cooling medium to the first plurality of conduits;
at least one second inlet line having a second inlet fluid connector for fluidly and removably connecting to the second plurality of conduits to collect the second cooling medium from the second plurality of conduits;
at least one second outlet line having a second outlet fluid connector for fluidly and removably connecting to the second plurality of conduits to distribute the second cooling medium to the second plurality of conduits;
a hot plate; and
a cold plate thermally coupled to the hot plate;
wherein, when connected to the manifold via the first outlet and first inlet fluid connectors, the first plurality of conduits and the first inlet and first outlet lines form a first fluid loop that allows the first cooling medium to circulate between the first plurality of conduits, the first inlet and first outlet lines, and the hot plate to transfer the heat from the one or more server modules to the hot plate; and
wherein, when connected to the manifold via the second outlet and second inlet fluid connectors, the second plurality of conduits and the second inlet and second outlet lines form a second fluid loop, separate from the first fluid loop, that allows the second cooling medium to circulate between the second plurality of conduits, the second inlet and second outlet lines, and the cold plate to transfer the heat from the cold plate to the cooling device at the location remote from the computer server.

* * * * *